(12) United States Patent
Tanaka

(10) Patent No.: US 7,844,768 B2
(45) Date of Patent: Nov. 30, 2010

(54) BLADE SERVER SYSTEM AND METHOD OF MANAGING SAME

(75) Inventor: Yoshimasa Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 1283 days.

(21) Appl. No.: 11/389,021

(22) Filed: Mar. 27, 2006

(65) Prior Publication Data

US 2006/0218326 A1 Sep. 28, 2006

(30) Foreign Application Priority Data

Mar. 28, 2005 (JP) ............................. 2005-091868

(51) Int. Cl.
*H05K 7/10* (2006.01)
*G06F 13/00* (2006.01)
*G06F 15/177* (2006.01)
*G06F 15/00* (2006.01)

(52) U.S. Cl. .................... 710/302; 710/15; 710/301; 710/104; 709/220; 709/221; 709/223; 712/1

(58) Field of Classification Search ................ 710/15, 710/301, 302; 709/223; 712/1
See application file for complete search history.

(56) References Cited

U.S. PATENT DOCUMENTS

| | | | | |
|---|---|---|---|---|
| 6,920,049 B2 * | 7/2005 | Brooks et al. | ............... | 361/727 |
| 6,925,540 B2 * | 8/2005 | Hawkins | ...................... | 711/161 |
| 6,968,414 B2 * | 11/2005 | Abbondanzio et al. | ...... | 710/301 |
| 7,302,593 B2 * | 11/2007 | Rothman et al. | ............ | 713/300 |
| 7,398,401 B2 * | 7/2008 | Goud et al. | .................. | 713/300 |
| 7,418,608 B2 * | 8/2008 | Kumar et al. | ............... | 713/320 |
| 7,444,667 B2 * | 10/2008 | Bulusu et al. | .................. | 726/1 |
| 7,483,974 B2 * | 1/2009 | Goud et al. | ................. | 709/224 |
| 7,499,987 B2 * | 3/2009 | Bogia | ........................ | 709/221 |
| 7,512,830 B2 * | 3/2009 | Chu et al. | ...................... | 714/4 |
| 7,583,591 B2 * | 9/2009 | Rothman et al. | ............ | 370/218 |
| 2004/0128562 A1 | 7/2004 | Bigelow et al. | | |
| 2006/0236140 A1 * | 10/2006 | Tanaka | ........................ | 713/300 |

FOREIGN PATENT DOCUMENTS

JP 07-219684 8/1995

(Continued)

OTHER PUBLICATIONS

"BladeCenter chassis management"—IBM Journal of Research and Development, Nov. 2005; 21 pages.*

*Primary Examiner*—Mark Rinehart
*Assistant Examiner*—Brian T Misiura
(74) *Attorney, Agent, or Firm*—Foley & Lardner LLP

(57) ABSTRACT

Each chassis includes a back plane having a plurality of slots and a CPU blade server and CMMs which are inserted in the slots, respectively. The back plane has a storage unit storing a housing number for identifying the housing, in-housing chassis numbers for identifying the chassis in the housing, and in-chassis slot IDs for identifying the slots. When the blade server is inserted into the corresponding slot, the blade server acquires the in-chassis slot ID from the back plane. When the CMMs are inserted into the corresponding slots, the CMMs acquire housing numbers and in-housing chassis numbers from the back plane, holds the housing number and the in-housing chassis numbers, and manages the configuration of the blade server through the back plane. One of the CMMs manages the other CMMs.

7 Claims, 2 Drawing Sheets

FOREIGN PATENT DOCUMENTS

| | | |
|---|---|---|
| JP | 9-237243 (A) | 9/1997 |
| JP | 2002-312297 (A) | 10/2002 |
| JP | 2003-296119 | 10/2003 |
| JP | 2004-7295 (A) | 1/2004 |
| JP | 2004-213651 | 7/2004 |
| WO | WO 03/011892 (A2) | 2/2003 |

* cited by examiner

BLADE SERVER SYSTEM AND METHOD OF MANAGING SAME

BACKGROUND OF THE INVENTION (1) Field of the Invention

The present invention relates to the system management of a blade server.

(2) Description of the Related Art

There is known a blade server system having a plurality of blades each including components required to provide a server, e.g., a CPU, a hard disk, etc. mounted on a single board, the blades being housed in a chassis (blade housing unit). The chassis also accommodates therein a power supply unit and a cooling fan that are required to operate the housed blades, and a network switch for making it possible to perform data communications between the blades. Usually, the chassis housing the blades is placed in a housing.

For performing the system management of the blade server system, there has been known a process using SNMP (Simple Network Management Protocol) as disclosed in Japanese laid-open patent publication No. 2004-213651. According to the system management using the SNMP, the network between the blades in the chassis and between different chassis is monitored to manage the configurations of devices, i.e., the blades, management modules, etc., which are connected to the network.

According to the conventional system management using the SNMP, however, since the configurational information of the devices is managed individually by the respective devices, but not uniformly by the system in its entirety, the management of the system configurations is complex. In addition, if a device needs to be replaced due to the occurrence of a fault, then as the faulty device carries its configurational information, the configurational information cannot easily be taken over.

SUMMARY OF THE INVENTION

It is an object of the present invention to provide a blade server system and a method of managing such a blade server system, which allow configurational information to be managed and set with ease.

To achieve the above object, there is provided in accordance with the present invention a blade server system comprising a back plane having a plurality of slots, a blade server and a chassis management module inserted respectively in the slots, a plurality of chassis each accommodating the back plane, the blade server, and the chassis management module, and at least one housing accommodating the plurality of chassis therein. The back plane has a storage unit storing a housing number for identifying the housing, in-housing chassis numbers for identifying the chassis in the housing, and in-chassis slot IDs for identifying the slots. When the blade server is inserted into the corresponding slot, the blade server acquires the in-chassis slot ID for identifying the slot in which the blade server is inserted from the back plane, and holds the acquired in-chassis slot ID. When the chassis management module is inserted into the corresponding slot, the chassis management module acquires the housing number and the in-housing chassis numbers from the back plane, holds the housing number and the in-housing chassis numbers, and manages the blade server which is inserted in the corresponding slot based on the in-chassis slot ID. One of the chassis management modules accommodated respectively in the chassis manages the other chassis management modules based on the housing number and the in-housing chassis numbers.

With the above arrangement, each of the chassis management modules in the respective chassis uniformly manages the configurations of the blade servers in the respective chassis, and one of the chassis management modules (master module) uniformly manages the other chassis management modules (slave modules). Devices, i.e., the blade server and the chassis management module, inserted in the slots of the back plane can thus be uniformly managed in the blade server system in its entirety.

When the chassis management module and the blade server are inserted into the slots, they acquire configurational information, i.e., the housing number, the in-house chassis numbers, and the in-chassis slot IDs, from the back plane. Consequently, in the event of a failure of a device such as a blade server or a chassis management module, simply inserting a new device into the slot from which the faulty device has been removed automatically provides configurational information from the back plane to the inserted new device. The provided configurational information is then uniformly managed in the blade server system. Accordingly, the configurational information of the faulty device does not need to be taken over.

According to the present invention, as described above, inasmuch as the configurations of the blade server and the chassis management module that are inserted in the slots of the back plane are uniformly managed by the blade server system in its entirety, the system management is made easier to perform than if performed by the conventional managing process using the SNMP. Furthermore, as the configurational information is acquired from the back plane, configurations can easily be reset in the event of a failure of the blade server and the chassis management module. As described above, the present invention offers advantages in that the blade server system can uniformly be managed easily and allows configurational changes to be made easily.

The above and other objects, features, and advantages of the present invention will become apparent from the following description with reference to the accompanying drawings which illustrate examples of the present invention.

DETAILED DESCRIPTION OF THE PREFERRED EMBODIMENT

Figure 1:
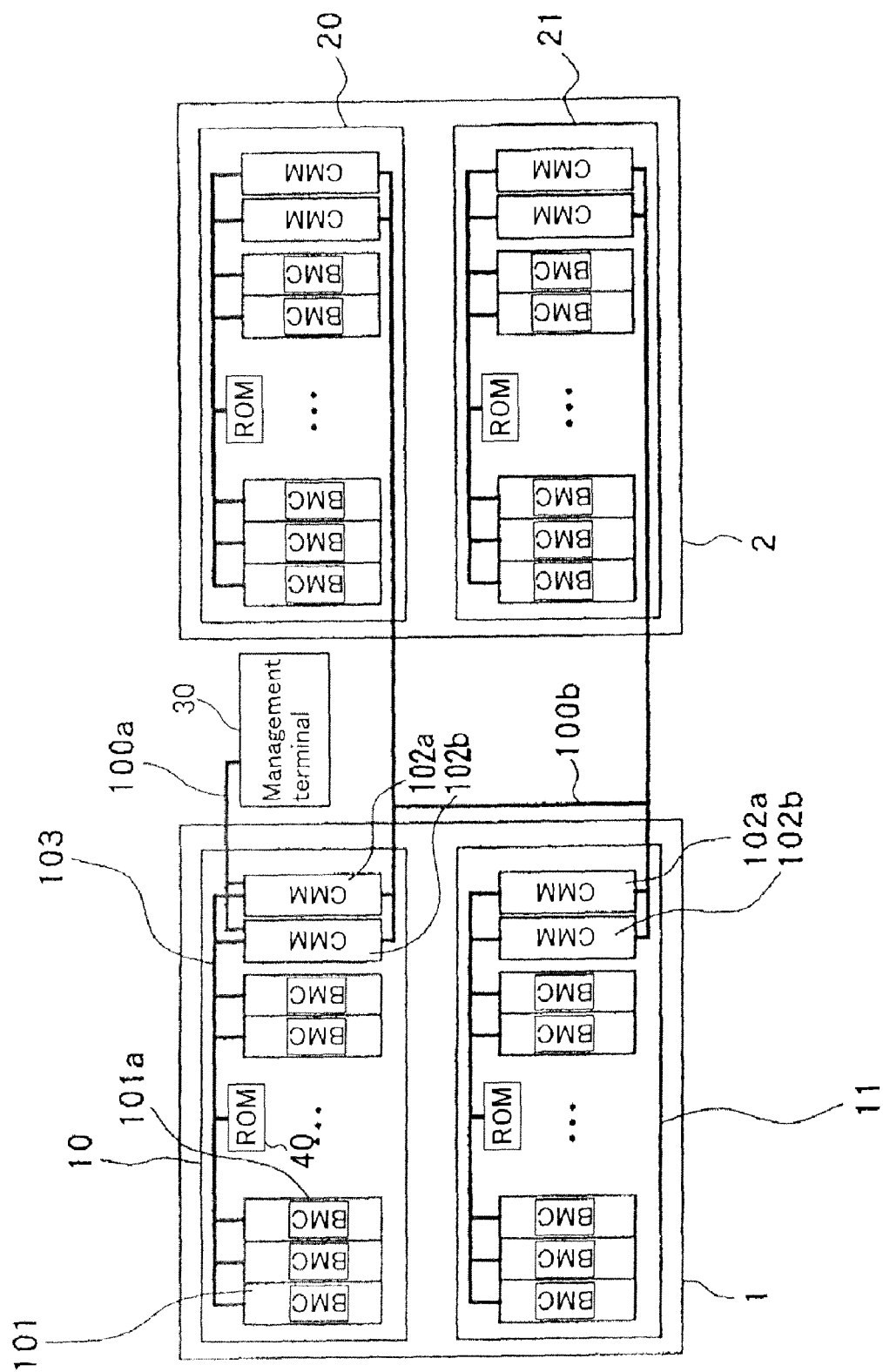
FIG. 1 is a block diagram of a general arrangement of a blade server system according to an embodiment of the present invention.

FIG. 1 shows in block form a general arrangement of a blade server system according to an embodiment of the present invention. As shown in FIG. 1, the blade server system has housing 1 accommodating chassis 10, 11 therein and housing 2 accommodating chassis 20, 21.

Chassis 10 has back plane 103 in the form of a circuit board or a device with a plurality of slots. A plurality of CPU blade servers 101 and two CMMs (Chassis Management Modules) 102a, 102b are inserted respectively in the slots of back plane 103. Chassis 10 also accommodates therein a power supply unit and a cooling fan. Electric power and input/output (I/O) interface signals are supplied to CPU blade servers 101 and CMMs 102a, 102b through back plane 103. CMMs 102a, 102b are of a redundant structure in which one of CMMs 102a, 102b serves as a primary CMM and the other a secondary CMM. If the primary CMM fails, then the secondary CMM takes over operation.

Each of CPU blade servers 101 has components required to provide a server, i.e., a memory, a CPU, a hard disk, etc., a network connection interface, and BMC (Baseboard Management Controller) 101a, which are mounted on a board.

Each of CMMs 102a, 102b comprises components required to provide a computer system, i.e., a memory, a CPU, etc., and a network connection interface, which are mounted on a board. Each of CMMs 102a, 102b is connected to each of CPU blade servers 101 through the network connection interfaces, and is also connected to management terminal 30 through network 100a. Management terminal 30 comprises a computer system, e.g., a personal computer, having a memory, a CPU, a communication unit, etc.

Each of chassis 11, 20, 21 is basically of the same structure as chassis 10. In FIG. 1, each of the CMMs housed in chassis 10 serves as a master, and each of the CMMs housed in other chassis 11, 20, 21 as a slave. Each of the master CMMs housed in chassis 10 is connected to each of the slave CMMs housed in other chassis 11, 20, 21 through network 100b.

Back plane 103 disposed in each of chassis 10, 11 20, 21 has a ROM 40 storing configurational information representing slot IDs, in-housing chassis numbers, housing numbers, and group numbers. The slot IDs are 20 unique IDs in the chassis, and are used to identify the blades inserted in the slots. The in-housing chassis numbers are numbers for identifying the chassis housed in the housings. The housing numbers are numbers for identifying the housings. The group numbers are numbers for identifying the slave CMMs that are managed by the master CMMs.

When the master CMMs are inserted into the respective slots, they acquire in-housing chassis numbers, housing numbers, and group numbers from the back plane and hold them. Similarly, when the slave CMMs are inserted into the respective slots, they acquire in-housing chassis numbers, housing numbers, and group numbers from the back plane and hold them.

When each CPU blade server 101 is inserted into its slot, BMC 101a acquires slot ID identification information about the slot from back plane 103, and holds the acquired slot ID identification information. Each CPU blade server 101 is supplied with electric power from the power supply through back plane 103. The system management such as power supply control, etc., in each CPU blade server 101 is controlled based on network communications performed between CPU blade server 101 and CMMs 102a, 102b through back plane 103.

Operation of the blade server system according to the present embodiment will be described below with reference to FIG. 2.

Figure 2:
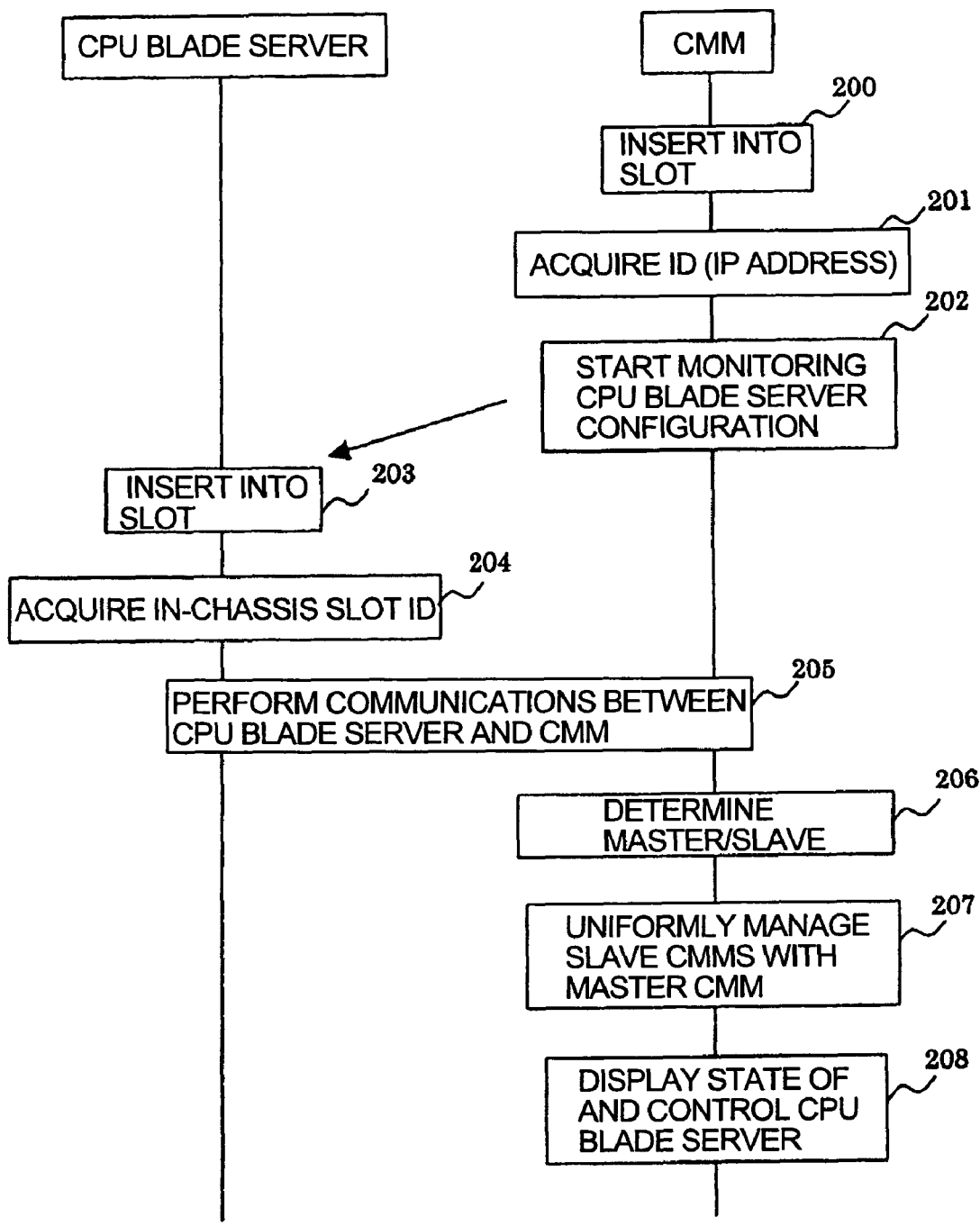
FIG. 2 is a flowchart of a system management process carried out by the blade server system shown in FIG. 1.

FIG. 2 shows a system management process carried out by the blade server system shown in FIG. 1. In each of chassis 10, 11, 20, 21, CPU blade servers 101 and CMMs 102a, 102b are inserted respectively into the slots of back plane 103.

When CMMs 102a, 102b are inserted into the corresponding slots, they are supplied with electric power from the power supply through back plane 103, and activate CMM-FW (firmware) to acquire housing numbers, in-housing chassis numbers, and group numbers from back plane 103 (step 200). Thereafter, the primary CMM as one of CMMs 102a, 102b acquires unique IDs (IP addresses or the like) from a DHCP or the like on network 100b through network 100b (step 201), and starts monitoring the configurations of the CPU blade servers inserted in the slots of back plane 103 (step 202).

Then, when CPU blade servers 101 inserted into the corresponding slots (step 203), their BMCs 101a are supplied with electric power from the power supply through back plane 103, and activate BMC-FW to acquire in-chassis slot IDs from back plane 103 (step 204). Thereafter, BMCs 101a and the primary CMM communicate with each other through back plane 103, and the primary CMM manages the configurations of the CPU blade servers in the chassis based on the in-chassis slot IDs (step 205). The system management of the CPU blade servers in the chassis can thus uniformly be performed.

After CPU blade servers 101 and CMMs 102a, 102b have been inserted in the slots in chassis 10, 11, 20, 21, master CMMs and slave CMMs that operate as masters and slaves in general-purpose network 100b interconnecting CMMs 102a, 102b in housings 1, 2 are determined according to a predetermined algorithm (step 206). The predetermined algorithm is an algorithm for determining a CMM with a youngest IP address as a master CMM, for example. In FIG. 1, the CMMs in chassis 10 are determined as master CMMs. The algorithm may be supplied from management terminal 30 to the CMMs or may be stored in the CMMs.

The master CMMs periodically collect housing numbers, in-housing chassis numbers, and group numbers from the slave CMMs, and manage the collected numbers (step 207). In this manner, the master CMMs uniformly manage the slave CMMs in the same group based on the housing numbers, the in-housing chassis numbers, and the group numbers. The master CMMs also communicate with the management terminal 30 according to a predetermined protocol such as TCP/IP or the like, and display the states of CPU blade servers 101 in each of the chassis and control CPU blade servers 101 based on a request from management terminal 30 (step 208). Therefore, management terminal 30 can perform system management of all CPU blade servers 101 that are housed in chassis 10, 11, 20, 21.

With the blade server system according to the present embodiment, as described above, the CPU blade servers in each of the chassis are uniformly managed by the slave CMMs, and the slave CMMs are uniformly managed by the master CMMs. Consequently, the user can easily control the power supply of the CPU blade servers housed in each of the chassis, monitor the operating states of those CPU blade servers, and collect log information from those CPU blade servers, using the management terminal that is connected to the master CMMs.

The configurational information of the CPU blade servers and the CMMs, i.e., slot ID information, in-housing chassis numbers, housing numbers, and group numbers, is stored in the ROMs of back planes 103. The CPU blade servers and the CMMs acquire the configurational information from the back plane when they are inserted into the respective slots. The user is therefore not required to set the configurational information of the CPU blade servers and the CMMs.

If a CPU blade server or a CMM suffers a failure and needs to be replaced with a new one, then configurational information is automatically provided from the back plane simply when the new CPU blade server or the new CMM is inserted into its slot. Uniform management is then performed by CMMs based on the provided configurational information. It is thus not necessary to take over the configurational information of the faulty device.

If a primary CMM fails to operate, then a secondary CMM takes over operation of the faulty primary CMM. Accordingly, the blade server system has a high level of safety.

The blade server system according to the present embodiment has been illustrated by way of example only, and its structural and operational details may be changed or modified. For example, each of the CMMs may have an authenticator for limiting access from management terminal 30. The authenticator authenticates a log-in event or a password. The authenticator incorporated in each of the CMMs makes it possible to provide auxiliary groups in each of the groups, and to realize system management in each of the auxiliary groups. In addition, the CPU blade server in each of the auxiliary groups can be managed at the user level without the need for a plurality of master CMMs.

Network 100b between the master CMMs and the slave CMMs and network 100a between management terminal 30 and the master CMMs may be separated from each other for easily constructing an environment and increasing security thereof.

Each of the back planes may have a plurality of ROMs. For example, the ROMs may be of a redundant structure in which one of ROMs serves as a primary ROM and the other a secondary ROM. If the primary ROM fails, then the secondary ROM is used. The redundant structure makes the blade server system highly reliable.

In the structure shown in FIG. 1, each of the chassis has a redundant system of CMMs for better reliability. However, each of the chassis may have a single CMM.

The blade server system may have one housing or three or more housings, rather than the two housings illustrated in FIG. 1.

Each of the housings may accommodate one chassis or three or more chassis, rather than two chassis illustrated in FIG. 1

Furthermore, the housings may accommodate different numbers of chassis.

While preferred embodiments of the present invention have been described using specific terms, such description is for illustrates purposes only, and it is to be understood that changes and variations may be made without departing from the spirit or scope of the following claims.

What is claimed is:

1. A blade server system comprising:
   a back plane having a plurality of slots;
   a blade server and a chassis management module inserted respectively in said slots;
   a plurality of chassis each accommodating said back plane, said blade server, and said chassis management module; and
   at least one housing accommodating said plurality of chassis;
   wherein said back plane having a storage unit storing a housing number for identifying said housing, in-housing chassis numbers for identifying the chassis in said housing, and in-chassis slot IDs for identifying said slots;
   when said blade server is inserted into the corresponding slot, said blade server acquires the in-chassis slot ID for identifying the slot in which said blade server is inserted from said back plane, and holds the acquired in-chassis slot ID;
   when said chassis management module is inserted into the corresponding slot, said chassis management module acquires said housing number and said in-housing chassis numbers from said back plane, holds the acquired housing number and the acquired in-housing chassis numbers, and manages the blade server which is inserted in the corresponding slot based on said in-chassis slot ID through said back plane; and
   one of the chassis management modules accommodated respectively in said chassis manages the other chassis management modules based on said housing number and said in-housing chassis numbers.

2. A blade server system according to claim 1, wherein each of the chassis management modules accommodated respectively in said chassis is connected to each other through a first network, and one of said chassis management modules is connected to a management terminal through a second network.

3. A blade server system according to claim 2, wherein each of the chassis management modules accommodated respectively in said chassis has an authenticator for limiting access from said management terminal.

4. A blade server system according to claim 2, wherein said first network and said second network are separable from each other.

5. A blade server system according to claim 1, wherein said back plane has a plurality of said storage units.

6. A blade server system according to claim 1, wherein the chassis management modules accommodated respectively in said chassis are of a redundant structure having a first management module and a second management module, and said first management module operates normally, and when said first management module fails, said second management module operates.

7. A method of managing a blade server system having a housing accommodating therein a plurality of chassis having a back plane which has a plurality of slots in which a blade server and a chassis management module are inserted, respectively, comprising the steps of:
   storing, in said back plane, a housing number for identifying said housing, in-housing chassis numbers for identifying the chassis in said housing, and in-chassis slot IDs for identifying said slots;
   when said chassis management module is inserted into the corresponding slot, acquiring said housing number and said in-housing chassis numbers from said back plane, holding the acquired housing number and the acquired in-housing chassis numbers, and starting to manage a configuration of the blade server which is inserted in the corresponding slot;
   when said blade server is inserted into the corresponding slot, acquiring the in-chassis slot ID for identifying the slot in which said blade server is inserted from said back plane, and holding the acquired in-chassis slot ID;
   controlling said chassis management module to manage the blade server which is inserted in the corresponding slot based on said in-chassis slot ID; and
   controlling one of the chassis management modules accommodated respectively in said chassis to manage the other chassis management modules based on said housing number and said in-housing chassis numbers.

* * * * *